United States Patent
Sharma et al.

(12)

(10) Patent No.: US 6,754,097 B2
(45) Date of Patent: Jun. 22, 2004

(54) READ OPERATIONS ON MULTI-BIT MEMORY CELLS IN RESISTIVE CROSS POINT ARRAYS

(75) Inventors: Manish Sharma, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 86 days.

(21) Appl. No.: 10/234,511

(22) Filed: Sep. 3, 2002

(65) Prior Publication Data

US 2004/0042263 A1 Mar. 4, 2004

(51) Int. Cl.[7] .............................................. G11C 11/00
(52) U.S. Cl. ...................................... 365/158; 365/173
(58) Field of Search ................................ 365/158, 173, 365/149, 171, 189.01, 209, 225.5

(56) References Cited

U.S. PATENT DOCUMENTS

| 6,191,989 B1 | 2/2001 | Scheuerlein |
| 6,259,644 B1 | 7/2001 | Tran et al. |
| 6,631,085 B2 * | 10/2003 | Kleveland et al. .......... 365/175 |
| 2002/0034096 A1 * | 3/2002 | Rosner et al. ............... 365/173 |

FOREIGN PATENT DOCUMENTS

| EP | 1109170 | 6/2001 |
| WO | WO9918578 | 4/1999 |

* cited by examiner

Primary Examiner—Richard Elms
Assistant Examiner—Nam Nguyen

(57) ABSTRACT

A data storage device includes a resistive cross point array of memory cells. Each memory cell includes serially-connected first and second resistive devices. Each resistive device has programmable first and second resistance states. The data storage device further includes pluralities of first, second and third conductors, and a read circuit. Each first conductor is connected to data layers of a column of the first magnetoresistive devices; each second conductor is connected to data layers of a column of second magnetoresistive devices; and each third conductor is between reference layers of a row of first and second magnetoresistive devices. The read circuit applies different first and second voltages during read operations. The first voltage is applied to the first and second conductors crossing a selected memory cell; and the second voltage is applied to the third conductor crossing the selected memory cell.

17 Claims, 4 Drawing Sheets

READ OPERATIONS ON MULTI-BIT MEMORY CELLS IN RESISTIVE CROSS POINT ARRAYS

BACKGROUND

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

An MRAM device may include one or more arrays of memory cells, word lines crossing rows of memory cells, and bit lines crossing columns of memory cells. Each memory cell is at the cross point of a word line and a bit line.

Each memory cell may include a magnetoresistive device such as a magnetic tunnel junction. Each magnetoresistive device stores a logic value by setting its resistance to one of two states. The logic value stored in a selected magnetoresistive device may be read by determining the resistance state of the selected magnetoresistive device. The resistance state may be determined by causing a sense current to flow through the selected magnetoresistive device, and detecting the sense current.

The magnetoresistive devices of the array are coupled together through many parallel paths. The resistance seen at one cross point equals the resistance of the magnetoresistive device at that cross point in parallel with resistances of magnetoresistive devices in the other rows and columns. Thus each array of magnetoresistive devices may be characterized as a cross point resistor network.

Because the magnetoresistive devices are connected as a cross point resistor network, parasitic or sneak path currents can interfere with the read operations on selected magnetoresistive devices. Blocking devices such as diodes or transistors may be connected to the magnetoresistive device. These blocking devices can block the parasitic currents.

In the alternative, the parasitic currents may be dealt with by using a an "equipotential" method disclosed in assignee's U.S. Pat. No. 6,259,644. The equipotential method disclosed in U.S. Pat. No. 6,259,644 involves applying a potential to a selected line, and providing the same potential to a subset of unselected bit lines and unselected word lines. The parasitic currents are shunted so as not to interfere with read operations.

DETAILED DESCRIPTION

Figure 1:
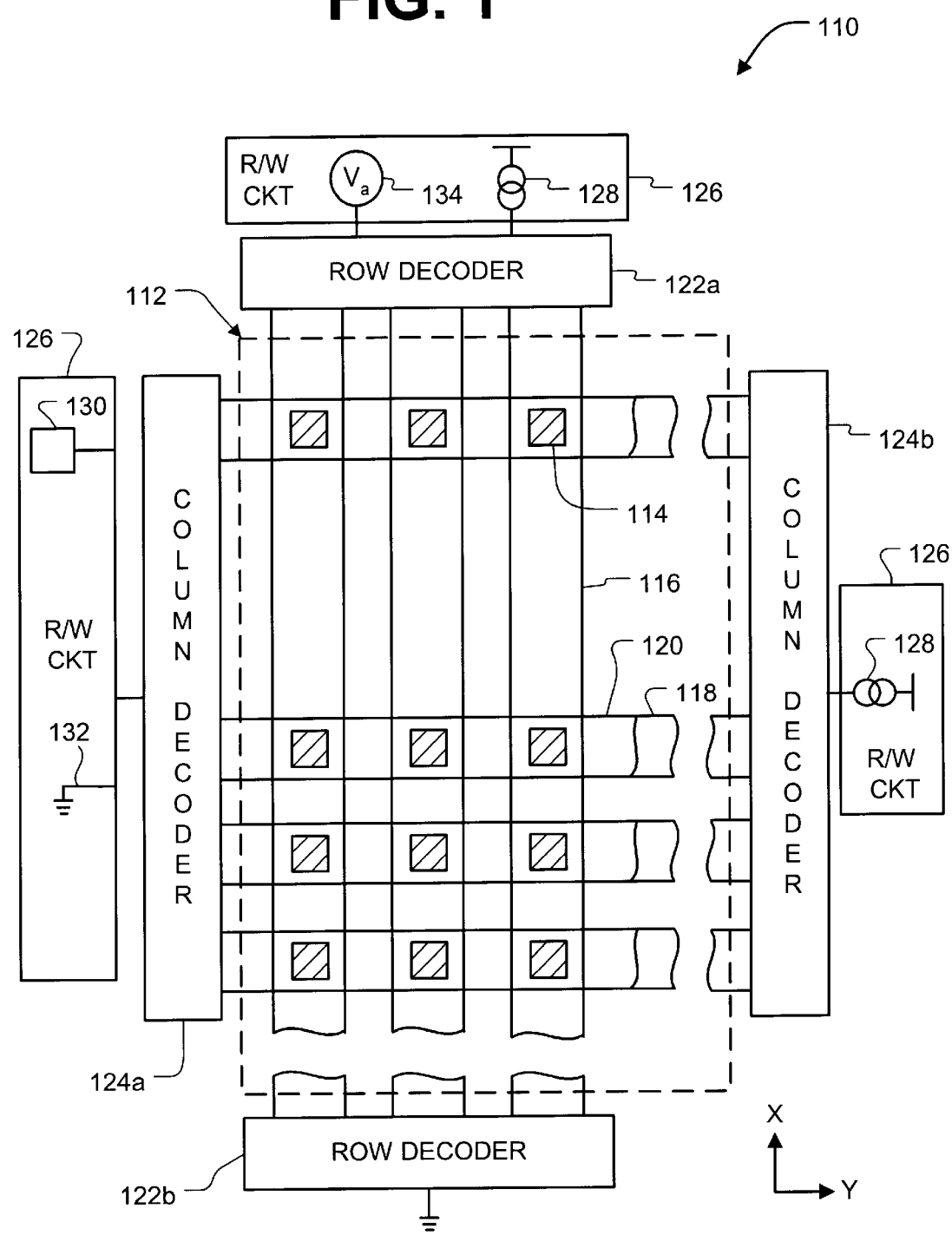
FIG. 1 is an illustration of an MRAM device according to an embodiment of the present invention.

Reference is now made to FIG. 1, which illustrates an MRAM device 110. The MRAM device 110 includes an array 112 of memory cells 114. Each memory cell 114 includes series-connected first and second magnetoresistive devices. The memory cells 114 are arranged in rows and columns, with the rows extending along an x-direction and the columns extending along a y-direction. Only a relatively small number of the memory cells 114 is shown to simplify the illustration of the MRAM device 110. In practice, arrays of any size may be used.

Word lines 116 extend along the x-direction. Each word line 116 connects a row of first magnetoresistive devices to a row of second magnetoresistive devices. First and second bit lines 118 and 120 extend along the y-direction. Each first bit line 118 is in contact with a column of the first magnetoresistive devices 10. Each first magnetoresistive device is located at a cross point of a word line 116 and a first bit line 118. Each second bit line 120 is in contact with a column of second magnetoresistive devices. Each second magnetoresistive device is located at a cross point of a word line 116 and a second bit line 120.

The magnetoresistive devices of the array 112 are coupled together through many parallel paths. The resistance seen at one cross point equals the resistance of the magnetoresistive device at that cross point in parallel with resistances of magnetoresistive devices in the other rows and columns. Thus each array of magnetoresistive devices may be characterized as a two-level cross point resistor network.

The MRAM device 110 further includes first and second row decoders 122a and 122b, first and second column decoders 124a and 124b, and a read/write circuit 126. The decoders 122a, 122b, 124a and 124b select word and bit lines 116, 118 and 120 during read and write operations.

The read/write circuit 126 includes current sources 128 for supplying write currents to selected word and bit lines 116, 118 and 120 during write operations. The read/write circuit 126 includes sense amplifiers 130, ground connections 132, and a voltage source 134 for applying voltages during read operations.

During a write operation, the read/write circuit 126 writes logic values to the first and second magnetoresistive devices of a selected memory cell 114. The logic values may be written to magnetoresistive devices such as tunnel junctions by setting the direction of the magnetization vectors in the data layers of the first and second tunnel junctions.

During a read operation, the read/write circuit 126 uses an equipotential method to cause sense currents to flow through the first and second magnetoresistive devices of a selected memory cell 114. Parasitic currents are shunted so as not to interfere with the sense currents. The read/write circuit 126 detects the sense currents to determine the resistance states of the first and second magnetoresistive devices.

Figure 2A:
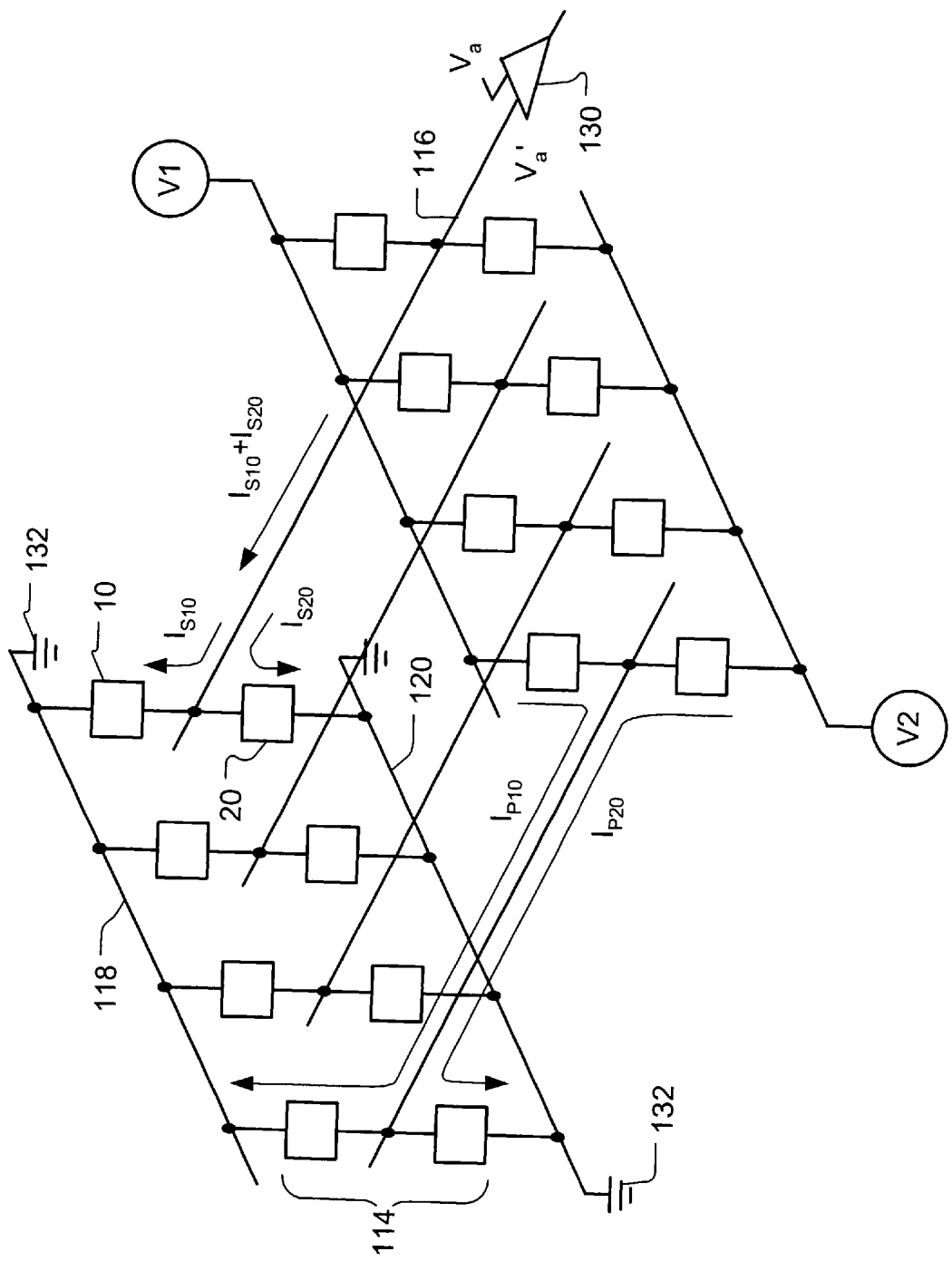
FIGS. 2a and 2b are illustrations of methods for reading an MRAM device according to embodiments of the present invention.

An embodiment of the equipotential method is shown in FIG. 2a. An array voltage ($V_a$) is applied to a first input of the sense amplifier 130, and the selected word line 116 is connected to a second input of the sense amplifier 130. The second input of the sense amplifier 130 couples the voltage ($V_a'$) to the selected word line 116, where $V_a'=V_a$. The selected bit lines 118 and 120 are connected to ground 132. Sense currents ($I_{S10}$, $I_{S20}$) flow through the first and second magnetoresistive devices 10 and 20. The sense amplifier 130 determines the resistance state of the selected memory cell 114 by generating an output voltage that is proportional to the total current ($I_{S10}+I_{S20}$) on the word line 116. If the two magnetoresistive devices have four detectably different resistance states, one of four different logic levels can be inferred from the sum of the currents ($I_{S10}+I_{S20}$).

To minimize parasitic currents, a voltage V1 is applied to all upper unselected bit lines 118, and a voltage V2 is applied to all lower unselected bit lines 120. All unselected word lines 116 are allowed to float. Parasitic currents ($I_{P10}$ and $I_{P20}$) flow though the magnetoresistive devices 10 and 20 to which the voltages V1 and V2 are applied. The voltages V1 and V2 may be set to the array voltage ($V_a$), whereby V1=V2=$V_a$.

Figure 2B:
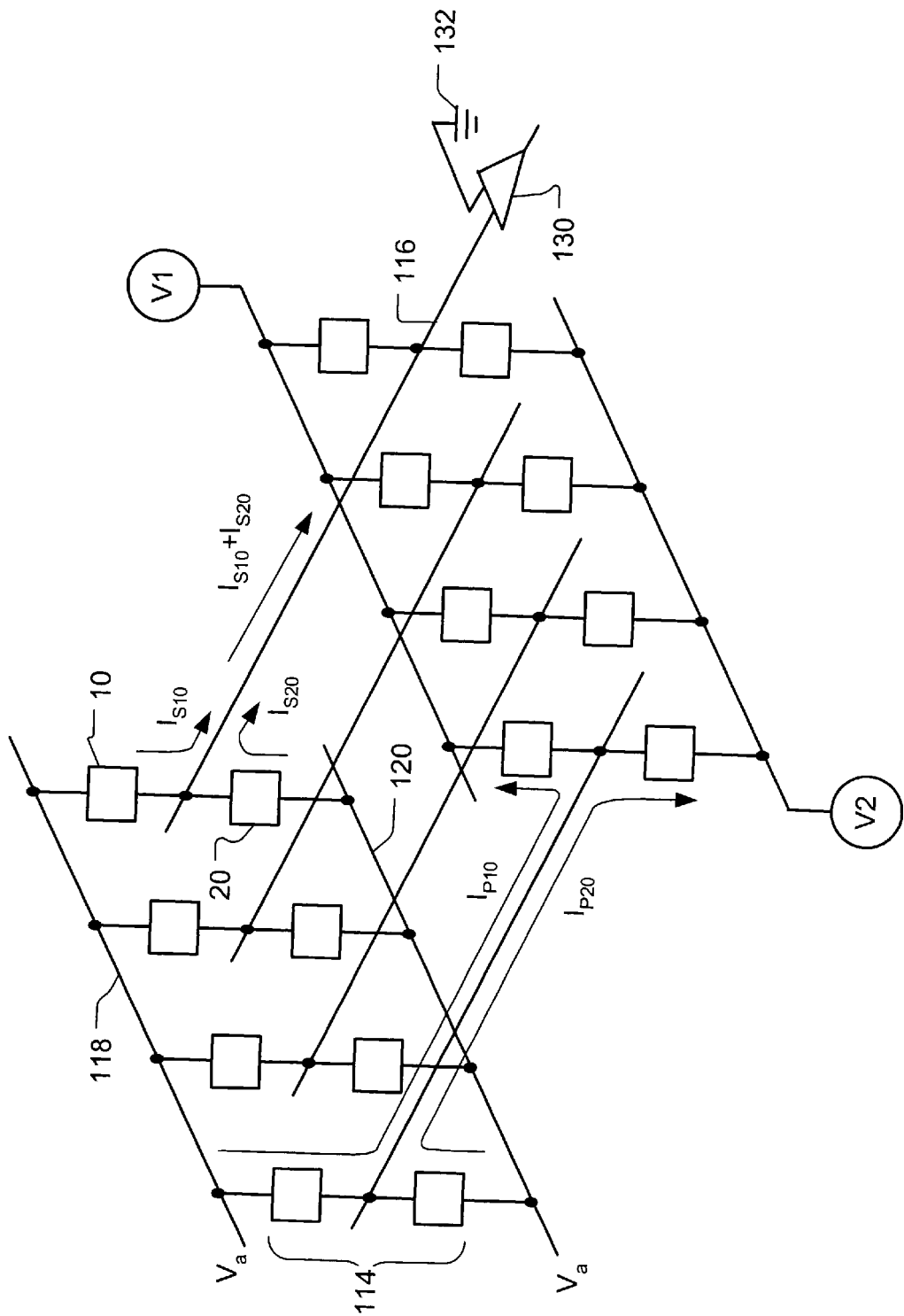

FIG. 2b shows another embodiment of the equipotential method. First and second inputs of the sense amplifier 130 are connected to ground (GND) and a selected word line 116, respectively. The array voltage ($V_a$) is applied to the selected bit lines 118 and 120. A voltage V1 is applied to all upper unselected bit lines 118, and a voltage V2 is applied to all lower unselected bit lines 120. V1=V2=GND. In the alternative, V1=∈ and V2=-∈, where ∈ is only a few (e.g., tens of) millivolts above ground (GND). Thus, GND<∈<<$V_a$. By biasing the upper and lower parts of the array 112 in this manner, the parasitic currents ($I_{P10}$, $I_{P20}$) do not to interfere with the sense currents ($I_{S10}$ and $I_{S20}$).

The memory cells are not limited to any particular type or construction. Exemplary memory cells including two magnetoresistive devices are illustrated in FIGS. 3 and 4.

Figure 3:
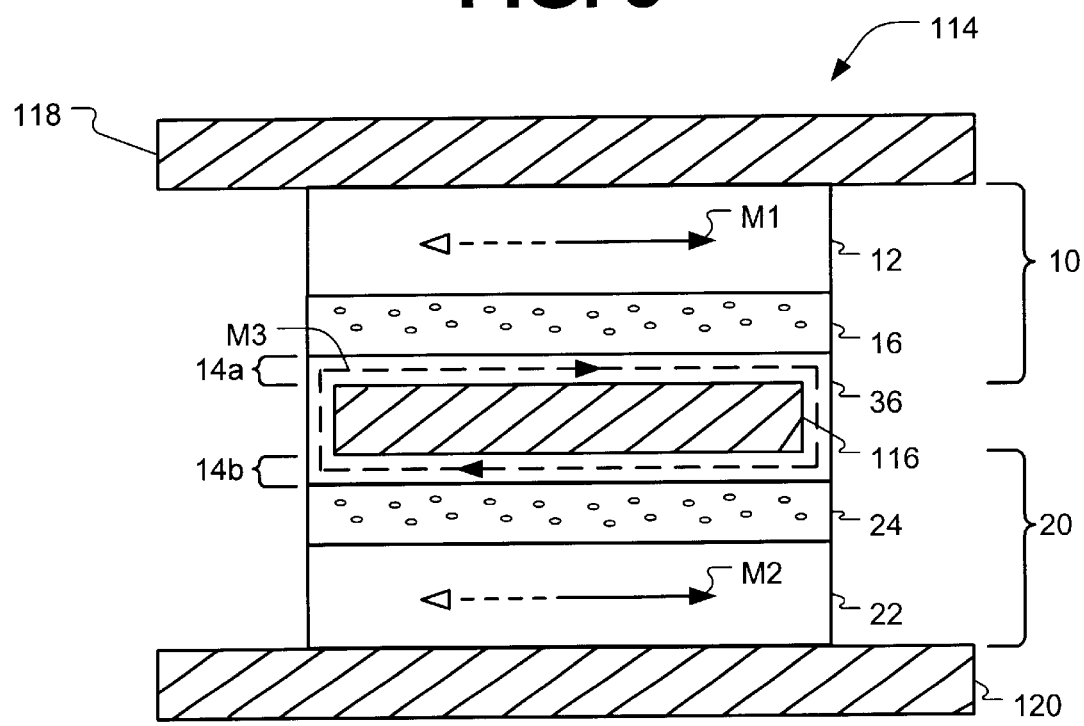
FIG. 3 is an illustration of a multi-bit memory cell according to a first embodiment of the present invention
Figure 4:
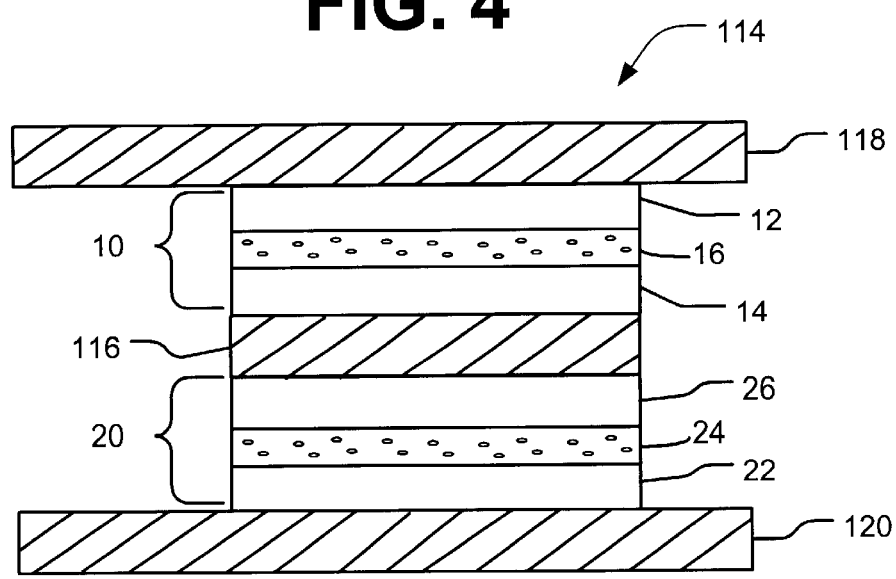
FIG. 4 is an illustration of a multi-bit memory cell according to a second embodiment of the present invention

Reference is now made to FIG. 3, which shows a dual-bit memory cell 114 including first and second magnetic tunnel junctions 10 and 20. The first magnetic tunnel junction 10 includes a first data layer 12, a first reference layer 14a, and a first insulating tunnel barrier 16 between the data layer 12 and the first reference layer 14a. The first data layer 12 is made of a ferromagnetic material and has a magnetization (represented by the vector M1) that can be oriented in either of two directions, typically along its easy axis (one direction is shown in solid, and the other direction is shown in dashed). The first reference layer 14a is also made of a ferromagnetic material and has a magnetization (represented by the vector M3) that can be oriented in either of two directions, typically along its easy axis. The easy axes of the first data layer 12 and the first reference layer 14a extend in the same direction.

If the magnetizations vectors (M1 and M3) of the first data layer 12 and the upper portion 14a of the reference layer 14 are pointing in the same direction, the orientation of the first magnetic tunnel junction 10 is said to be "parallel." If the magnetization vectors (M1 and M3) of the first data layer 12 and the upper portion 14a of the reference layer 14 are pointing in opposite directions, the orientation of the first magnetic tunnel junction 10 is said to be "anti-parallel." These two stable orientations, parallel and anti-parallel, may correspond to logic values of '0' and '1.'

The first insulating tunnel barrier 16 allows quantum mechanical tunneling to occur between the first data layer 12 and the first reference layer 14a. This tunneling phenomenon is electron spin dependent, causing the resistance of the first magnetic tunnel junction 10 to be a function of the relative orientations of the magnetization vectors (M1 and M3) of the first data layer 12 and the first reference layer 14a. For instance, resistance of the first magnetic tunnel junction 10 is a first value (R) if the magnetization orientation of the magnetic tunnel junction 10 is parallel and a second value (R1+ΔR1) if the magnetization orientation is anti-parallel. The first insulating tunnel barrier 16 may be made of aluminum oxide ($Al_2O_3$), silicon dioxide ($SiO_2$), tantalum oxide ($Ta_2O_5$), silicon nitride ($Si_3N_4$), aluminum nitride (AlN), or magnesium oxide (MgO). Other dielectrics and certain semiconductor materials may be used for the first insulating tunnel barrier 16.

The second magnetic tunnel junction 20 includes a second data layer 22, a second reference layer 14b, and a second insulating tunnel barrier 24 between the second data layer 22 and the second reference layer 14b. The second data layer 22 is made of a ferromagnetic material and has a magnetization (represented by the vector M2) that can be oriented in either of two directions, typically along its easy axis. The second reference layer 14b is also made of a ferromagnetic material, and has a magnetization (represented by the same vector M3) that can be oriented in either of two directions, typically along its easy axis. The second insulating tunnel barrier 24 allows quantum mechanical tunneling to occur between the second data layer 22 and the second reference layer 14b. Resistance of the second magnetic tunnel junction 20 is a function of the relative orientations of the magnetization vectors (M2 and M3) of the second data layer 12 and the second reference layer 14b.

The word line 116 is clad with a ferromagnetic cladding 36. The first reference layer 14a is formed by that portion of the cladding 36 between the word line 116 and the first insulating tunnel barrier 16. The second reference layer 14b is formed by that portion of the cladding 36 between the word line 116 and the second insulating tunnel barrier 24. The depiction of the cladding thickness relative to the word line 116 is exaggerated. The thickness of the cladding 36 may be about 1 nm to 50 nm (with a typical value of 4 nm).

The first bit line 118 is in contact with the first data layer 12, and the second bit line 120 is in contact with the second data layer 22.

Supplying a current to the word line 116 causes a magnetic field to be generated about the word line 116. If the current flows into the word line 116, the magnetic field causes the reference layer magnetization vector (M3) to point to in a clockwise direction about the word line 116 (as shown in FIG. 3). If the current flows in the opposite direction, the magnetic field causes the reference layer magnetization vector (M3) to point in a counter-clockwise direction about the word line 116. The magnetization points in one direction in the first reference layer 14a and points in an opposite direction in second reference layer 14b. The cladding 36 provides a conductive path for the magnetic field.

Coercivity of the data layers 12 and 22 is much higher than coercivity of the reference layers 14a and 14b. The data layer coercivity may be at least 2–5 times greater than the reference layer coercivity. For example, the data layer coercivity may be about 25 Oe, and the reference layer coercivity may be about 5 Oe. Thus the reference layers 14a and 14b are considered "softer" than the data layers 12 and 22 because the reference layer magnetization vector (M3) is much easier to flip. It is preferred to make the reference layer coercivity as low as possible.

Reference is now made to FIG. 4, which shows another type of dual-bit memory cell 114. A first bit 10 of the memory cell 114 includes a spacer layer 16, a data layer 12 on one side of the spacer layer 16, and a hard reference layer 14 on the other side of the spacer layer 16. A second bit 20 includes a spacer layer 24, a data layer 22 on one side of the spacer layer 24, and a hard reference layer 26 on the other side of the spacer layer 24. If the bits 10 and 20 are magnetic tunnel junctions, the spacer layers 16 and 24 are insulating tunnel barriers, and the reference layers 14 and 26 are pinned layers. A pinned layer has a magnetization orientation that is fixed so as not to rotate in the presence of an applied magnetic field in a range of interest. Thus data layer magnetization can be oriented in either of two directions: the same direction as the pinned layer magnetization, or the opposite direction of the pinned layer magnetization.

The magnetization orientation of a pinned layer may be fixed by an antiferromagnetic (AF) pinning layer (not shown). The AF pinning layer provides a large exchange field, which holds the magnetization of the pinned layer in one direction.

A word line 116 is connected to the reference layers 14 and 26 of both bits 10 and 20, a first bit line 118 is connected to the data layer 12 of the first bit 10, and a second bit line 120 is connected to the data layer 22 of the second bit 20. The first bit 10 has two resistance states, and the second bit 20 has two resistance states. If the four resistance states are detectably different, a single read operation can reveal the resistance state of the memory cell 114.

The memory cells are not limited to two bits. Additional bits may be added by adding magnetoresistive devices per memory cell.

The present invention is not limited to magnetic tunnel junctions. The present invention encompasses other types of magnetoresistive devices, such as giant magnetoresistive (GMR) devices. A GMR device has the same basic configuration as a TMR device, except that data and reference layers are separated by a conductive non-magnetic metallic layer instead of an insulating tunnel barrier. The relative orientations of the data and reference magnetization vectors affect in-plane resistance of a GMR device. Other types of devices include top and bottom spin valves.

The present invention is not limited to magnetoresistive devices. Memory elements of the memory cells may be of a phase-change material. Resistance of such elements may be changed from one state to another by a phase alteration of the phase change material (e.g., from a crystalline state to an amorphous state).

Instead, the memory cells may include polymer memory elements. Polymer memory elements are made of polar conductive polymer molecules. In a polymer memory element, data is stored as a 'permanent polarization' in a polymer molecule (in contrast to an MRAM memory cell, where data is stored as a 'permanent magnetic moment'). Resistance of a polymer memory element (whether R or R+ΔR) is dependent upon the orientation of polarization of the polymer molecules. Polymer memory cells elements may be read by sensing their resistance. Polymer memory cells may be written by applying electric fields generated by voltages applied to selected word and bit lines.

Although several specific embodiments of the present invention have been described and illustrated, the present invention is not limited to the specific forms or arrangements of parts so described and illustrated. Instead, the present invention is construed according to the claims the follow.

What is claimed is:

1. A data storage device comprising
   a resistive cross point array of memory cells, each memory cell including serially-connected first and second resistive devices, each resistive device having programmable first and second resistance states;
   a plurality of first conductors, each first conductor connected to data layers of a column of the first magnetoresistive devices;
   a plurality of second conductors, each second conductor connected to data layers of a column of second magnetoresistive devices;
   a plurality of third conductors, each third conductor between reference layers of a row of first and second magnetoresistive devices; and
   a read circuit for applying different first and second voltages during read operations, the first voltage applied to the first and second conductors crossing a selected memory cell, the second voltage applied to the third conductor crossing the selected memory cell.

2. The data storage device of claim 1, wherein the read circuit measures total current on the third conductor to determine the resistance states of the first and second magnetoresistive devices of the selected memory cell.

3. The data storage device of claim 1, wherein the read circuit further applies third and fourth voltages during read operations, the third voltage applied to first conductors crossing unselected memory cells, the fourth voltage applied to second conductors crossing unselected memory cells.

4. The data storage device of claim 3, wherein the first voltage is ground, and the second, third and fourth voltages are equal to an array voltage.

5. The data storage device of claim 3, wherein the first voltage is an array voltage, and the second, third and fourth voltages are ground.

6. The data storage device of claim 3, wherein the first voltage is an array voltage, the second voltage is ground, the third voltage equals $\in$ and the fourth voltage equals $-\in$, where ground $<\in<<V_a$.

7. The data storage device of claim 1, wherein the read circuit includes a sense amplifier for applying the second voltage to the second conductor crossing the selected memory cell.

8. The data storage device of claim 1, wherein the resistive devices are magnetoresistive devices.

9. The data storage device of claim 8, wherein the magnetoresistive devices are magnetic tunnel junctions.

10. A data storage device comprising:
    a plurality of magnetoresistive devices connected as a two-level cross point resistor network;
    means for performing read operations on selected magnetoresistive devices of the arrays; and
    means for shunting parasitic currents during the read operations.

11. A circuit for a data storage device having a plurality of first conductors extending in a first direction, a plurality of second conductors extending in the first direction, and a plurality of third conductors extending in a second direction, the circuit comprising:
    means for selecting first, second and third conductors during read operations; and
    means for applying different first and second voltages during read operations, the first voltage applied to the selected first and second conductors, the second voltage applied to the selected third conductors.

12. The circuit of claim 11, wherein the voltage-applying means includes a sense amplifier for measuring total current on the third conductor during read operations.

13. The circuit of claim 12, wherein the sense amplifier applies the second voltage to the selected second conductors.

14. The circuit of claim 11, wherein the voltage-applying means further applies third and fourth voltages during read operations, the third voltage applied to unselected first conductors, the fourth voltage applied to unselected second conductors.

15. The circuit of claim 14, wherein the first voltage is ground, and the second, third and fourth voltages are equal to an array voltage.

16. The circuit of claim 14, wherein the first voltage is an array voltage, and the second, third and fourth voltages are ground.

17. The circuit of claim 14, wherein the first voltage is an array voltage, the second voltage is ground, the third voltage equals $\in$ and the fourth voltage equals $-\in$, where ground $<\in<<V_a$.

* * * * *